(12) United States Patent
Bui (10) Patent No.: US 8,779,521 B2
(45) Date of Patent: Jul. 15, 2014

(54) AUTO SWITCH MOSFET

(76) Inventor: Dac Thong Bui, Glenroy (AU)

( * ) Notice: Subject to any disclaimer, the term of this patent is extended or adjusted under 35 U.S.C. 154(b) by 0 days.

(21) Appl. No.: 13/639,857

(22) PCT Filed: Oct. 3, 2011

(86) PCT No.: PCT/AU2011/001262
§ 371 (c)(1),
(2), (4) Date: Mar. 27, 2013

(87) PCT Pub. No.: WO2012/040795
PCT Pub. Date: Apr. 5, 2012

(65) Prior Publication Data
US 2013/0127519 A1   May 23, 2013

(30) Foreign Application Priority Data

Oct. 2, 2010  (AU) .................. 2010226940

(51) Int. Cl.
*H01L 29/78* (2006.01)
*H03K 17/687* (2006.01)
*H01L 27/092* (2006.01)

(52) U.S. Cl.
CPC .......... *H01L 29/7831* (2013.01); *H03K 17/687* (2013.01); *H01L 27/092* (2013.01)
USPC ........................................... 257/366; 257/394

(58) Field of Classification Search
USPC .................... 257/365, 366, 394, 316
See application file for complete search history.

(56) References Cited

U.S. PATENT DOCUMENTS

| 3,602,782 | A  | * | 8/1971 | Klein ............................. 257/394 |
| 3,811,076 | A  | * | 5/1974 | Smith, Jr. ....................... 257/296 |
| 7,067,873 | B2 | * | 6/2006 | King et al. ..................... 257/321 |
| 7,986,005 | B2 | * | 7/2011 | Schilling et al. ............... 257/341 |

* cited by examiner

*Primary Examiner* — Mark Prenty (57) ABSTRACT

In one preferred form shown in FIGS. 2*a* to 2*c* there is provided a field effect transistor (24). The field effect transistor includes an off switch gate (42) and a switch bridge semiconductor (44). The switch bridge (44) is provided for charging the off switch gate (42) such that the off switch gate (42) is able to screen the electric field of the control gate (32) of the field effect transistor.

20 Claims, 7 Drawing Sheets

Fig. 1
BACKGROUND

AUTO SWITCH MOSFET

FIELD OF THE INVENTION

In preferred forms, the present invention relates to a metal oxide semiconductor field effect transistor (MOSFET). In preferred forms the present invention provides a switch of a particular form.

BACKGROUND TO THE INVENTION

The present application was developed by the applicant of Australian patent application AU2010201661 filed 27 Apr. 2010. The development of the present invention was made by the Applicant against this backdrop and the problem of power wastage by current MOS-FET technology.

The present application claims convention priority from Australian patent AU2010226940 filed 2 Oct. 2010 and sealed 7 Jul. 2011. Australian Patent AU2010226940 refers to a number of issues relating to the various forms of power loss in connection with CMOS technology. The Applicant reserves the right to find application for the present invention in the area CMOS technology. The Applicant believes that the present invention provides a semiconductor device particularly suited to applications such as laser applications involving timed switching control.

Reference to any prior art in the specification is not, and should not be taken as, an acknowledgment or any form of suggestion that this prior art forms part of the common general knowledge in Australia or any other jurisdiction or that this prior art could reasonably be expected to be ascertained, understood and regarded as relevant by a person skilled in the art.

SUMMARY OF THE INVENTION

According to a first aspect of preferred embodiments herein described there is provided a field effect transistor including an off switch gate and a switch bridge; the switch bridge for charging the off switch gate such that the off switch gate is able to screen the electric field of the control gate of the field effect transistor.

Preferably the source and drain terminals and body region below the control gate of the field effect transistor form one forward-bias p-n junction and one reverse-bias p-n junction with the switch bridge being relatively lightly doped and being connected to the body region to allow the exchange of charges between the off switch gate and the body region, when the field effect transistor is turned on.

Preferably the switching gate is situated within the insulating field layer between the control gate and the body region, the switching bridge being connected to the body of the field effect transistor, to allow the exchange of charges between the off switch gate and the body region, when the field effect transistor is turned on.

Preferably the switching bridge is placed within the insulating field layer so as to be electrically isolated except for the connection to the switching gate and the body, the switching bridge having a higher electrical resistance than the body so that it will take longer to charge the off-switch gate than to form the a conductive channel between the source and drain terminals.

Preferably the conducting duration is only a fraction of the duration on the input signal, the input signal serving to turn the field effect transistor on.

Preferably the off switch gate is able to screen the electric field of the control gate of the field effect transistor to switch off the current between the source terminal and the drain terminal.

According to a second aspect of preferred embodiments herein described there is provided an off-switch n-type field effect transistor comprising:
  (i) a standard NMOS transistor having a drain, source, p-type body, gate oxide region and a control gate;
  (ii) a polysilicon or metal off-switch gate being located within said gate oxide region between said control gate and the p-type body, wherein said off-switch gate is used to screen the electric field of the control gate;
  (iii) a lightly doped p-type silicon switch bridge being located within said gate oxide region and connecting said off-switch gate to the p-type body of said NMOS, said switch bridge having doping density much less than the density of said p-type body and allowing the exchange of charges between the off-switch gate and the p-type body. According to a third aspect of preferred embodiments herein described there is provided an off-switch p-type field effect transistor comprising:
  (i) a standard PMOS transistor having a drain, source, n-type body, gate oxide and a control gate;
  (ii) a polysilicon or metal off-switch gate being located within said gate oxide between said control gate and the n-type body, wherein said off-switch gate is used to screen the electric field of the control gate;
  (iii) a lightly doped n-type silicon switch bridge being located within said oxide gate layer and connecting said off-switch gate to the n-type body of said PMOS, said switch bridge having doping density much less than the density of said n-type body and allowing the exchanges of charges between the off-switch gate and the n-type body.

Preferably the off switch gate is arranged such that, in use, when the off-switch gate is charged it screens the electric field from the control gate to thereby stop current flow between the source and drain.

Preferably the off-switch gate is a metal gate.

Preferably the off-switch gate is a polysilicon gate.

According to a fourth aspect of preferred embodiments herein described there is provided a method of providing a field effect transistor comprising: providing an off switch gate within the insulating layer of the field effect transistor, with the off switch gate being connected to the body of the field effect transistor via a switch bridge with a doping density much less than the density of the body of the field effect transistor to at least partially switch off the current between source terminal and the drain terminal shortly after the control gate of the field effect transistor has been turned on.

Preferably the method includes applying a voltage to the control gate of the field effect transistor to induce a conductive channel underneath it in the body of the field effect transistor; inducing a current to flow from the body into an off switch gate via a switch bridge, the off switch gate and switch bridge being provided in the insulating field layer of the field effect transistor, the switch bridge having a higher electrical resistance than the body such that it will take longer to fill the off switch gate; and screening the electric field from the control gate once the off switch gate is charged to reduce the charges within the conductive channel.

Preferably the method includes providing a blockage such that substantially no current passes through channel after the off-switch gate is fully charged with electrons.

Preferably the duration of conduction is selected by choosing the doping density of the switch bridge.

Preferably the method employs a field effect transistor that is an otherwise conventional mosfet effectively equipped with an off switch.

According to a fifth aspect of preferred embodiments herein described there is provided a field effect transistor comprising: a control gate; a body region; a source terminal and a drain terminal, the source and drain terminals for conducting current; wherein the control gate is provided to induce a channel of charges with the body region between the source terminal and the drain terminal, the field effect transistor including a switch bridge and an off switch gate; the off switch gate for screening the body region from an electric field of the control gate; the switch bridge for charging the off switch gate such that when fully charged the off switch gate reduces the charges within the conductive channel between the source terminal and the drain terminal such that the field effect transistor ceases conducting electricity between the source and drain terminal; the switch bridge having a higher electrical resistance than the body region such that current is allowed to flow between the source and drain terminals whilst the off switch gate is charging to provide a conducting duration between the source and drain terminals only a fraction of the duration of an input signal applied to the control gate.

Further advantages and preferred features of embodiments of the present invention will be apparent from the drawings and a reading of the specification as a whole.

As used herein, except where the context requires otherwise, the term "comprise" and variations of the term, such as "comprising", "comprises" and "comprised", are not intended to exclude further additives, components, integers or steps.

BRIEF DESCRIPTION OF DRAWINGS

In order to facilitate a better understanding of the present invention, several preferred embodiments will now be described with reference to the accompanying drawings, in which:

FIG. 2b comprises a three dimensional schematic side view of the n-type mosfet shown in FIG. 2a;

FIG. 2c comprises a three dimensional schematic perspective view of the n-type mosfet shown in FIG. 2a;

FIG. 3 comprises a two dimensional schematic view of the n-type mosfet shown in FIG. 2a;

FIG. 4b comprises a three dimensional schematic side view of the p-type mosfet shown in FIG. 4a;

FIG. 4c comprises a three dimensional schematic perspective view of the p-type mosfet shown in FIG. 4a;

FIG. 5 comprises a two dimensional schematic view of the p-type mosfet shown in FIG. 4a;

DETAILED DESCRIPTION OF THE EMBODIMENTS

Figure 1:
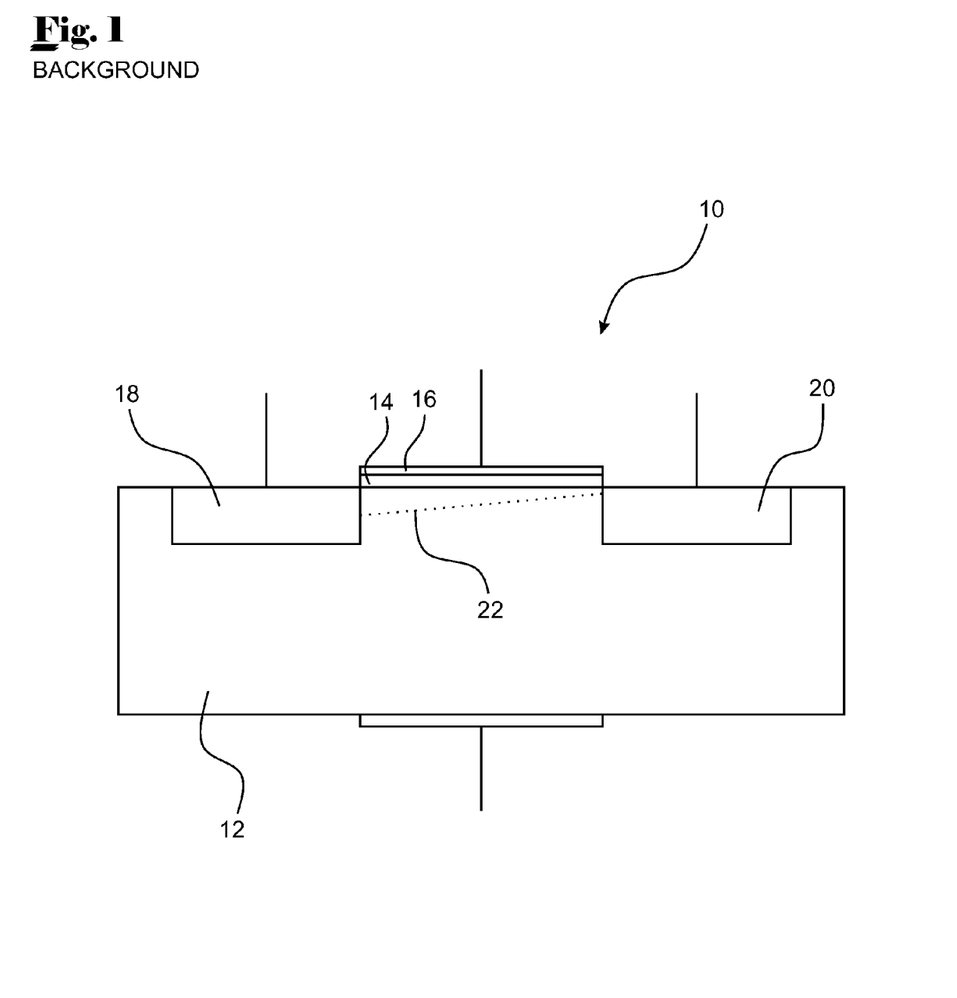
FIG. 1 comprises a two dimensional schematic view of a conventional mosfet.

Referring to FIG. 1 there is shown a conventional mosfet field effect transistor 10. The field effect transistor includes a body 12, an insulating field layer 14, a control gate layer 16, a source terminal 18, and a drain terminal 20. By applying a voltage on the control gate layer 16 the field effect transistor 10, is able to induce a conducting channel 22 between the source terminal 18 and the drain terminal 20.

As is known the expression 'mosfet' is a general term used in the art. Whilst the expression is an abbreviation of 'metal oxide field effect transistor' mosfet technology also refers to mosfets having gates that are not made from metal and insulating layers that are not made from oxide. The term 'mosfet' would accordingly be understood in a broad manner so as to indicate insulated gate field effect transistors in general.

Figure 2A:
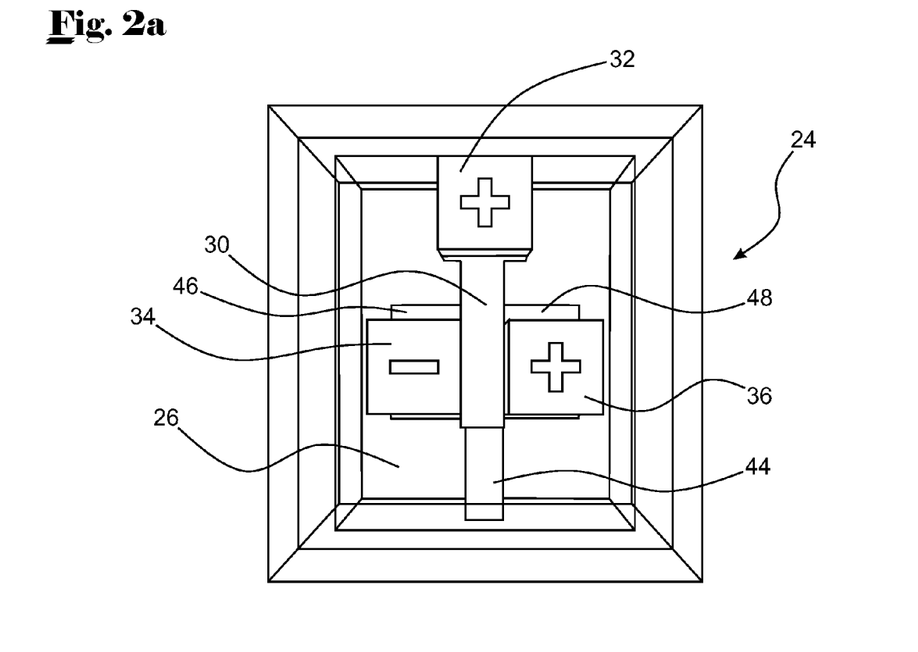
FIG. 2a comprises a three dimensional schematic top view of an n-type mosfet according to a first preferred embodiment of the present invention.
Figure 2B:
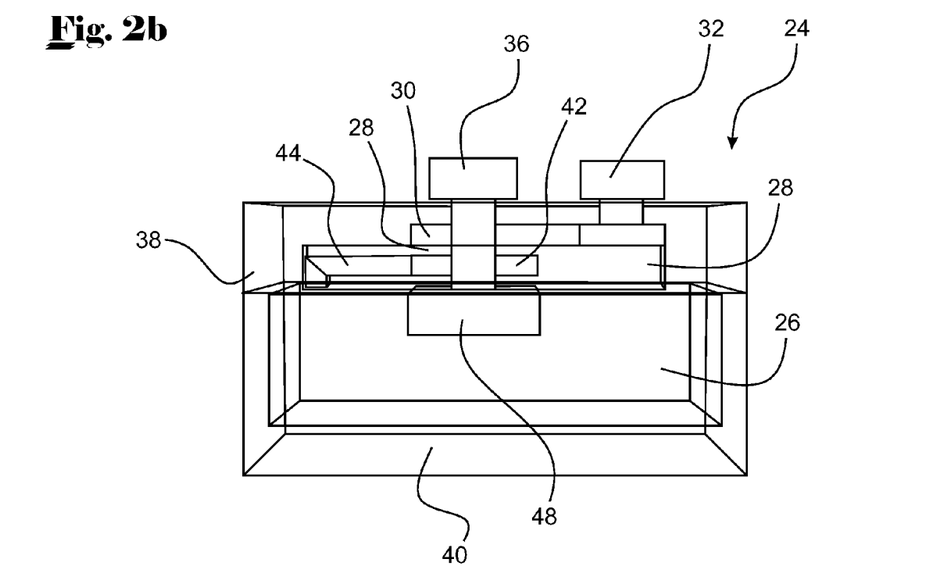
Figure 2C:
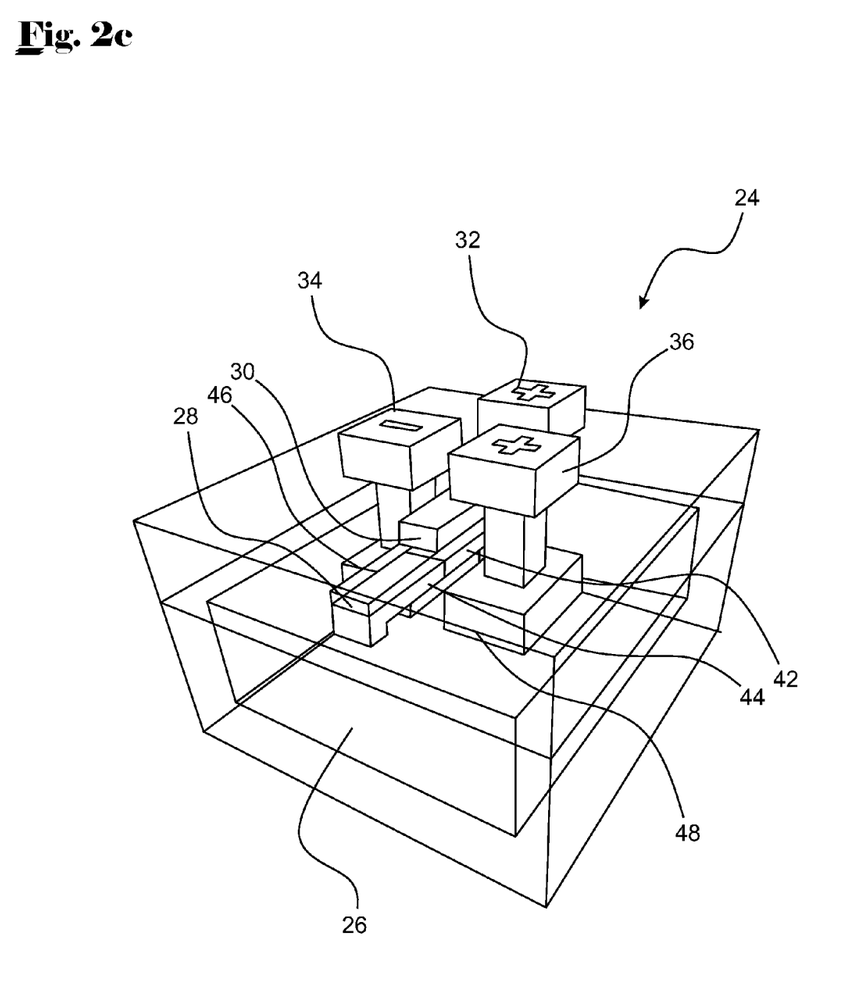

Referring to FIG. 2, there is shown a 'mosfet' field effect transistor 24 according to a first preferred embodiment of the present invention. As will be described in further detail below, the field effect transistor 24 advantageously switches off the current between the source and drain terminal shortly after the field effect transistor 24 has been turned on.

With the use of a double quote (") and referring to similar features shown in FIG. 1, the field effect transistor 24 includes a body 12" in the form of semiconductor body 26. An insulating field layer 14" is provided in the form of insulating gate oxide 28. A control gate layer 16" is provided in the form a polysilicon input gate 30. The polysilicon input gate 30 is connected to an input gate terminal/electrode 32.

A source terminal 18" is provided in the form of negative terminal/source 34. A drain terminal 20" is provided in the form of positive terminal/voltage drain 16. The body is insulated by insulating field oxide 38. A silicon substrate 40 is provided.

In distinction from a conventional field effect transistor, the field effect transistor 24 is advantageously provided with an off switch gate 42 and a switch bridge 44 as shown in FIGS. 2a to 2c.

More particularly, in this embodiment, an NMOS arrangement is provided. Accordingly the source terminal 34 includes n-type silicon 46. The drain terminal 36 includes n-type silicon 48. The body is provided in as p-type silicon 26.

With the p/n-type silicon arrangement described the present embodiment seeks to provide a modified NMOS possibly with equivalent function to much larger CMOS arrangements providing an auto-off switch. As would be apparent from the Figures, an auto-switch n-type field effect transistor 24 is provided. The NMOS 24 includes a structure based on a conventional NMOS, but equipped with an off-switch provided by the off switch gate 42 and a switch bridge 44.

The NMOS 24 is composed of all the standard components including an insulating field oxide layer 38, a silicon substrate 40, a lightly doped p-body 26, two highly doped n-type semiconductor regions 46, 48 which are connected to a negative terminal 34 and a positive terminal 36, an input gate or control gate 30 connected to an input electrode 32, and an insulating gate oxide layer 28.

Unlike a conventional NMOS transistor however, in this embodiment, the auto-switch NMOS illustrated is also provided with a polysilicon or metal off-switch gate 42 which is situated within the gate oxide layer 28 between the control gate 30 and the p-type body 26.

On some level, structurally and functionally, the off-switch gate 24 is possibly similar to the floating gate of the flash memory cell. However, unlike the floating gate which is electrically isolated, the off-switch gate 42 is connected to the p-type body 26 via the switch bridge 44. The bridge 44 is constructed from lightly doped p-type silicon with a doping density much less than the density of the p-type body 26. The applicant envisages that a possible range of the dopant density of the switch bridge 44 will be between 1/16 to 1/10 of the dopant density of the p-body. If we take the dopant density of the p-body as $1 \times 10^{16}$ cm$^{-3}$, then the density for the switch bridge will be between $6.25 \times 10^{14}$ cm$^{-3}$ to $1 \times 10^{15}$ cm$^{-3}$ (−3). Various theoretical and practical dopant densities are able to be determined with appropriate modelling.

The switch bridge 44 is also placed within the gate oxide layer 28 and is isolated from the rest of the field effect transistor/structure except for the connection to the off-switch gate 42 and p-type body 26. Because of its lower doping density, the switch bridge 44 has a higher electrical resistance than the p-type body 26.

When a positive voltage is applied to the control gate 30, the control gate 30 will induce, underneath it, a conductive channel of negative charges within the p-type body 26. At the same time the control gate 30 will induce electrons to flow from the p-type body 26 into the off-switch gate 42 via the switch bridge 44. Because the switch bridge 44 has a higher electrical resistance than the p-type body 26, it will take longer to fill the off-switch gate 42 with electrons than to form the conductive channel induced by the control gate 30.

As a result, a current is allowed to flow between the source 34 and the drain 36 terminals while the off-switch gate 42 is being filled with electrons. Once the off switch gate 42 is fully charged, it will serve to screen the electric field from the control gate 30 and reduce the charges within the conductive channel 56.

The electric field from a weakly formed channel will not be strong enough to breach the reverse-bias p-n junction (considering a simple model) and the transistor will cease to conduct electricity even if the control gate 30 is still supplied with a positive voltage. This set up means that the conducting duration of the NMOS 24 will be only a fraction of the duration of the input signal.

As a result there is provided a field effect transistor 24 including an off switch gate 42 and a switch bridge 44. The switch bridge 44 is provided for charging the off switch gate 42 such that the off switch gate 42 is used to screen the electric field of the control gate 30 of the field effect transistor to switch off the current between source terminal 34 and drain terminal 36 shortly after the control gate 30 of the field effect transistor 24 has been turned on.

As would be apparent the NMOS 24 has only one current and one off-switch. The NMOS 24 provides an auto-switch NMOS in which the blockage is complete and no current passes through after the off-switch gate is fully charged with electrons.

The duration of conduction by the auto-switch NMOS 24 can be selected by choosing the doping density of the switch bridge 44. A higher doping density will result in shorter conduction duration while a lower doping density will prolong the conduction duration. Again various theoretical and practical duration times are able to be determined with appropriate modelling.

In the case of an ordinary MOS-FET, the duration of the output signal is slightly shorter than the duration of the input signal. In comparison, the duration of the truncated output signal of the auto-switch MOS-FET of the present embodiment will be significantly shorter than the duration of the input signal. One possibility for an auto-switch MOS-FET of the present embodiment would be to have a ratio between the output duration and the input signal duration between $1/10$ to $1/4$.

There are many factors which determine how quickly the off-switch gate will be activated or how short the output signal duration will be including: the doping density of the switch bridge; the dimension of the off-switch gate relative to the rest of the transistor; the voltage difference between the input gate and the underlying doped silicon; the distance between the off-switch gate and the input gate; and the geometry or shape of the off-switch gate.

The applicant considers that the possibility of consistent off switch conduction times is particularly advantageous in several applications including those involving pulsed lasers where the time must be controlled.

In the present embodiment the NMOS 24 operates to provide an off switch gate 42 within the insulating layer of the field effect transistor 24. The off switch gate is connected to the body of the field effect transistor via a switch bridge 44 having a doping density much less that the density of the body of the field effect transistor 24.

Figure 3:
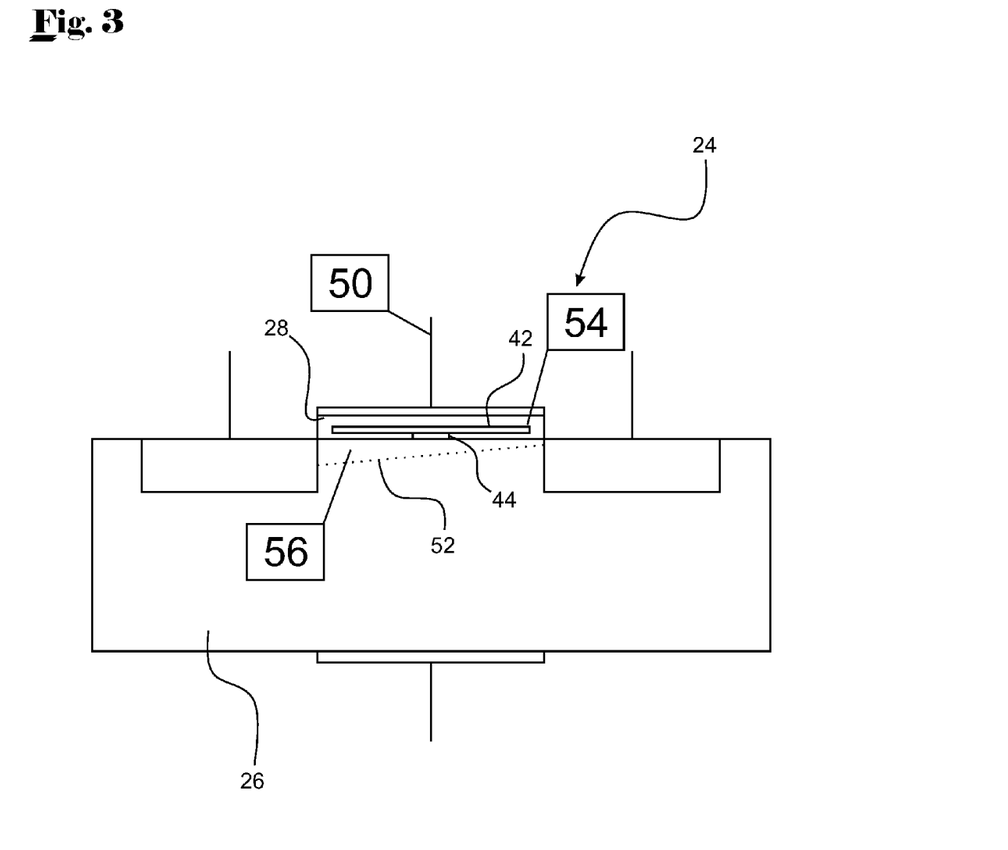

The manner of operation of the field effect transistor 24 is illustrated in FIG. 3. As shown at block 50 the NMOS 24 is operated by applying a voltage to the control gate 30 of the field effect transistor 24 to induce a conductive channel 52 underneath it in the body of of the field effect transistor 24. At block 54 the operation includes inducing a current to flow from the body 26 into the off switch gate 42 via the switch bridge 44. The off switch gate 42 and the switch bridge 44 are provided in the insulating field layer 28 of the field effect transistor 24. Furthermore, the switch bridge 44 has a higher electrical resistance than the body 26 such that it will take longer to fill the off switch gate 42. At block 56 the operation includes screening the electric field from the control gate 30 once the off switch gate 42 is charged to reduce the charges within the conductive channel 52. This serves to shorten the duration of current conduction through the channel.

As would be apparent, it is much more difficult to create a channel and maintain a current flow than to disrupt the flow across it. In the case of the present embodiment the applicant considers that there is no need to destroy the whole channel in order to stop the current flow, a partial disruption along the channel length is considered effective. Also the off-switch gate needs not cover the whole length of the conductive channel. From a simplified viewpoint it is considered that if electric field is cut across the whole width of the conductive channel, the flow will be disrupted. As such the length of the off-switch gate can be a fraction of the conductive channel length. Such a gate will have smaller effective mass and shorter activation time.

One possibility being considered by the application is tapering the under surface of the off-switch gate to concentrate the electric field to enhance its cutting effect. The applicant is also considering applications of a partial block of the current instead of a complete current cut off. Such an off-switch gate once activated will allow a smaller current to flow through and keep the device in a "stand-by" mode after the initial current flow. As such, in these embodiments, the off switch gate operates to at least partially switch off the current between source terminal and the drain terminal shortly after the control gate of the field effect transistor has been turned on.

The underlying principle of action of the auto-switch NMOS 24 can be used to create an autoswitch PMOS according to a further preferred embodiment of the present invention. Both are in effect field effect transistors. The structure and function of the auto-switch PMOS will be described with reference FIGS. 4a to 4c.

The auto-switch NMOS of the preferred embodiment is considered in certain applications to have smaller static power and dynamic switching power dissipation than an equivalent arrangement involving n/p type field effect transistors to provide an auto off switch. Since the auto-switch NMOS of this embodiment is provided as a single component it is considered to be particular efficient.

Figure 4A:
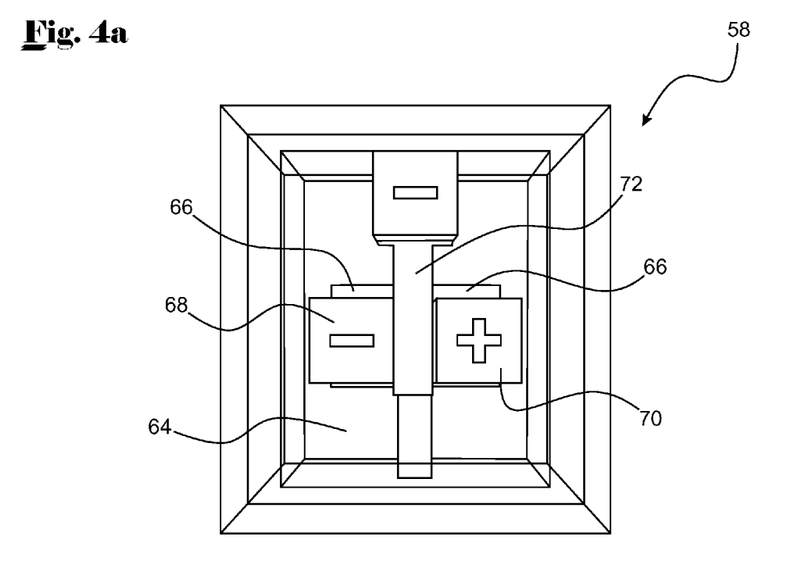
FIG. 4a comprises a three dimensional schematic top view of an p-type mosfet according to a second preferred embodiment of the present invention.
Figure 4B:
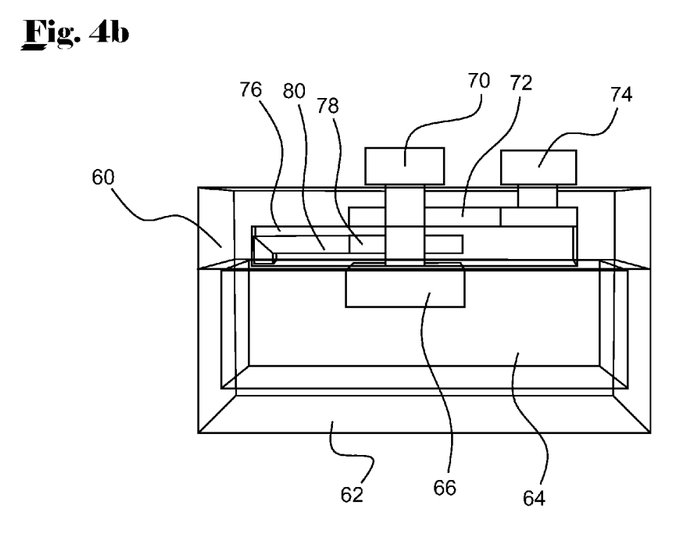
Figure 4C:
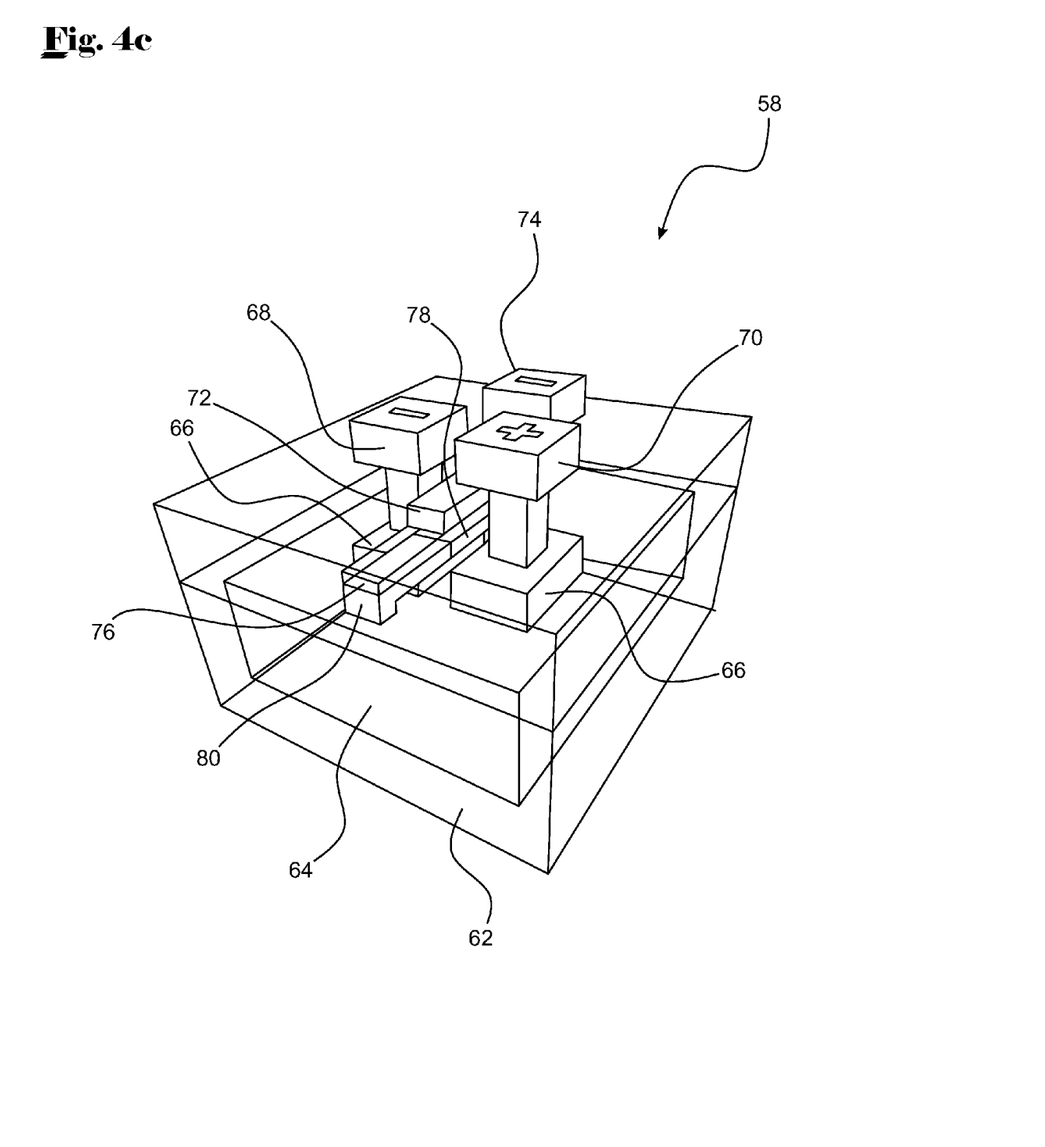
Figure 5:
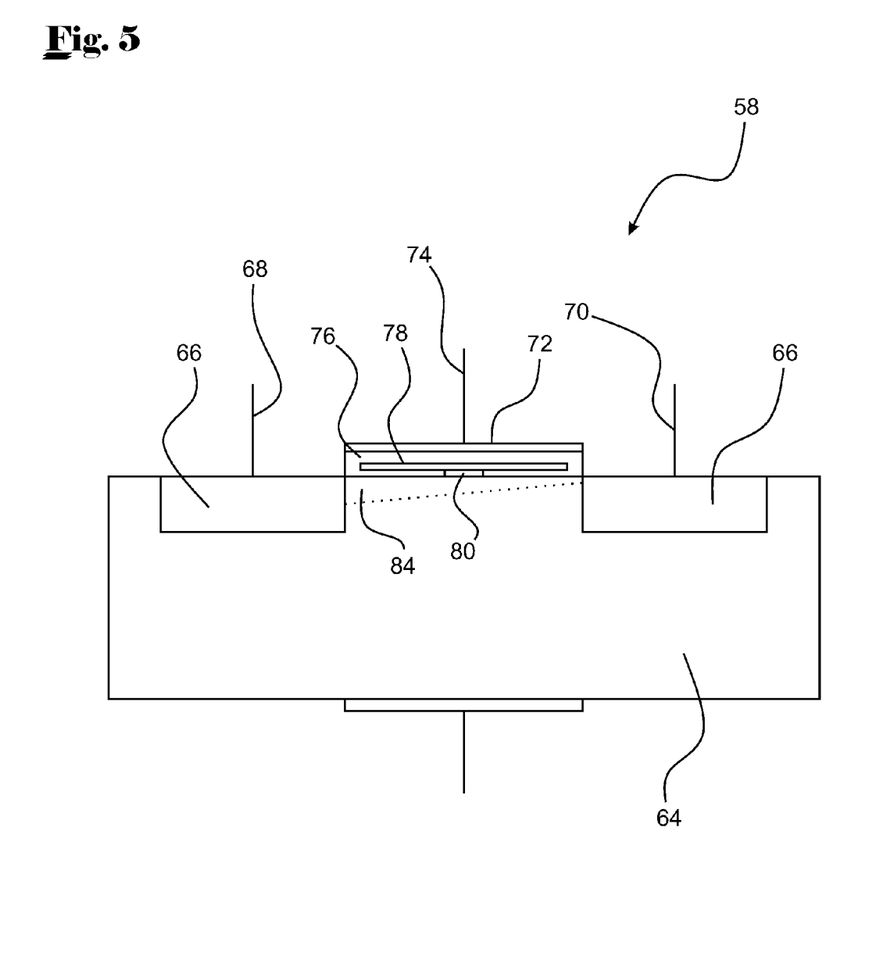

As shown, there provided is an auto-switch PMOS 58 which includes an otherwise conventional PMOS equipped with an off-switch. Said PMOS 58 is generally conventional and includes an insulating field oxide layer 60, a silicon substrate 62, a lightly doped n-body 64, two highly doped p-type semiconductor regions 66 which are connected to a negative terminal 68 and a positive terminal 70, an input gate or control gate 72 is connected to an input electrode 74, and an insulating gate oxide layer 76. A two dimensional schematic representation is shown in FIG. 4.

Unlike the conventional PMOS transistor, the auto-switch PMOS of the present embodiment is further provided with a polysilicon or metal off-switch gate 78 which is situated within the gate oxide layer 76 and between the control gate 72 and the n-type body 64.

The off switch gate 78 is connected to the n type body 64 via a switch bridge 80. The switch bridge 80 is constructed from lightly doped n-type silicon with a doping density much less than the density of the n-type body 64. The switch bridge 80 is also placed within the gate oxide layer 76 and is isolated from the rest of the structure except for the connection to the off-switch gate 78 and n-type body 64 as shown. Because of its lower doping density, the switch bridge 80 has a higher electrical resistance than the n-type body 64.

When a negative voltage is applied to the control gate 72, the control gate 72 will induce, underneath it, a conductive channel 84 of positive charges within the n-type body 64. At the same time the control gate 72 will push electrons from the off-switch gate 78, into the n-type body 64 via the switch bridge N. Because the switch bridge has a higher electrical resistance than the n-type body 64, it will take longer to remove electrons from the off-switch gate 78 than to clear electrons and form a conductive channel in the n-type body 64. As a result, a current is temporarily allowed to flow between the source and drain terminals 68, 70. Once the off-switch gate 78 is devoid of electrons, it will screen the electric field from the control gate 72 and reduce the positive charges within the conductive channel 84 in the n-type body 64. The electric field from a weakly formed channel will not be strong enough to breach the reverse-bias p-n junction (ie effectively provide the threshold voltage) and the transistor will cease to conduct electricity even if the control gate 72 is still supplied with a negative voltage.

As discussed it is considered that the auto-switch field effect transistors described will find application in several circumstances where the characteristics of the field effect transistors are advantageous. As described the off-switch is inherently provided in the field effect transistor itself.

It is to be recognised that various alterations and equivalent forms may be provided without departing from the spirit and scope of the present invention. This includes modifications within the scope of the appended claims along with all modifications, alternative constructions and equivalents. There is no intention to limit the present invention to the specific embodiments shown in the drawings. The present invention is to be construed beneficially to the applicant and the invention given its full scope.

In the present specification, the presence of particular features does not preclude the existence of further features. The words 'comprising', 'including' and 'having' are to be construed in an inclusive rather than an exclusive sense.

The claims defining the invention are as follows:

1. A field effect transistor including an off switch gate and a switch bridge semiconductor; the switch bridge semiconductor connected to the off switch gate for charging the off switch gate to screen the electric field of the control gate of the field effect transistor.

2. A field effect transistor as claimed in claim 1 wherein the source and drain terminals and the body region below the control gate of the field effect transistor form one forward-bias p-n junction and one reverse-bias p-n junction with the switch bridge being relatively lightly doped and being connected to the body region to allow the exchange of charges between the off switch gate and the body region, when the field effect transistor is turned on.

3. A field effect transistor as claimed in claim 1 wherein the off switch gate is situated within the insulating field layer between the control gate and the body region, the switch bridge being connected to the body of the field effect transistor, to allow the exchange of charges between the off switch gate and the body region, when the field effect transistor is turned on.

4. A field effect transistor as claimed in claim 1 wherein the switch bridge is placed within the insulating field layer so as to be electrically isolated except for the connection to the off switch gate and the body, the switch bridge having a higher electrical resistance than the body so that it will take longer to charge the off-switch gate than to form the a conductive channel between the source and drain terminals.

5. A field effect transistor as claimed in claim 1 wherein the conducting duration is only a fraction of the duration of the input signal, the input signal serving to turn the field effect transistor on.

6. A field effect transistor as claimed in claim 1 wherein the off switch gate is able to screen the electric field of the control gate of the field effect transistor to switch off the current between the source terminal and the drain terminal of the field effect transistor.

7. An off-switch n-type field effect transistor comprising:
 (i) a standard NMOS transistor having a drain, source, p-type body, gate oxide region and a control gate;
 (ii) a polysilicon or metal off-switch gate being located within said gate oxide region between said control gate and the p-type body, wherein said off-switch gate is used to screen the electric field of the control gate; and
 (iii) a lightly doped p-type silicon switch bridge semiconductor being located within said gate oxide region and connecting said off-switch gate to the p-type body of said NMOS, said switch bridge semiconductor having doping density much less than the density of said p-type body and allowing the exchange of charges between the off-switch gate and the p-type body.

8. An off-switch p-type field effect transistor comprising:
 (i) a standard PMOS transistor having a drain, source, n-type body, gate oxide and a control gate;
 (ii) a polysilicon or metal off-switch gate being located within said gate oxide between said control gate and the n-type body, wherein said off-switch gate is used to screen the electric field of the control gate; and
 (iii) a lightly doped n-type silicon switch bridge semiconductor being located within said oxide gate layer and connecting said off-switch gate to the n-type body of said PMOS, said switch bridge semiconductor having doping density much less than the density of said n-type body and allowing the exchanges of charges between the off-switch gate and the n-type body.

9. A field effect transistor as claimed in claim 7 wherein the off switch gate is arranged such that, in use, when the off-switch gate is charged it screens the electric field from the control gate to stop current flow between the source and drain.

10. A field effect transistor as claimed in claim 8 wherein the off-switch gate is a metal gate.

11. A field effect transistor as claimed in claim 8 wherein the off-switch gate is a polysilicon gate.

12. A method of operation comprising: using a switch bridge semiconductor of a field effect transistor including an off switch gate and the switch bridge semiconductor; the switch bridge semiconductor being used to charge the off switch gate; the off switch gate being located within the insulating layer of the field effect transistor and connected to the body of the field effect transistor via the switch bridge semiconductor; the switch bridge semiconductor having a doping density much less than the density of the body of the field effect transistor; the charging of the off switch gate at least partially switching off the current between source terminal and the drain terminal shortly after the control gate of the field effect transistor has been turned on.

13. A method as claimed in claim 12 including applying a voltage to the control gate of the field effect transistor to induce a conductive channel underneath it in the body of the field effect transistor; inducing a current to flow from the body into the off switch gate via a switch bridge, the off switch gate and switch bridge being provided in the insulating field layer of the field effect transistor, the switch bridge having a higher electrical resistance than the body such that it will take longer to fill the off switch gate; and screening the electric field from the control gate once the off switch gate is charged to reduce the charges within the conductive channel.

14. A method as claimed in claim 13 including providing a blockage such that substantially no current passes through channel after the off-switch gate is fully charged with electrons.

15. A method as claimed in claim 12 wherein the duration of conduction is selected by choosing the doping density of the switch bridge.

16. A method as claimed in claim 12 wherein the method employs a field effect transistor that is an otherwise conventional mosfet effectively equipped with an off switch.

17. A field effect transistor comprising: a control gate; a body region; a source terminal and a drain terminal, the source and drain terminals for conducting current; wherein the control gate is provided to induce a channel of charges with the body region between the source terminal and the drain terminal, the field effect transistor including a switch bridge semiconductor and an off switch gate; the off switch gate for screening the body region from an electric field of the control gate; the switch bridge for charging the off switch gate such that when fully charged the off switch gate reduces the charges within the conductive channel between the source terminal and the drain terminal such that the field effect transistor ceases conducting electricity between the source and drain terminal; the switch bridge having a higher electrical resistance than the body region such that current is allowed to flow between the source and drain terminals whilst the off switch gate is charging to provide a conducting duration between the source and drain terminals that is only a fraction of the duration of an input signal applied to the control gate.

18. A field effect transistor as claimed in claim 7 wherein the off switch gate is arranged such that, in use, when the off-switch gate is charged it screens the electric field from the control gate to stop current flow between the source and drain.

19. A field effect transistor as claimed in claim 7 wherein the off-switch gate is a metal gate.

20. A field effect transistor as claimed in claim 7 wherein the off-switch gate is a polysilicon gate.

* * * * *